(12) United States Patent
Koike et al.

(10) Patent No.: US 7,635,544 B2
(45) Date of Patent: Dec. 22, 2009

(54) TRANSPARENT SUBSTRATE FOR MASK BLANK AND MASK BLANK

(75) Inventors: Kesahiro Koike, Tokyo (JP); Osamu Suzuki, Tokyo (JP); Akihiro Kawahara, Tokyo (JP)

(73) Assignee: Hoya Corporation, Tokyo (JP)

( * ) Notice: Subject to any disclaimer, the term of this patent is extended or adjusted under 35 U.S.C. 154(b) by 710 days.

(21) Appl. No.: 11/224,087

(22) Filed: Sep. 13, 2005

(65) Prior Publication Data

US 2006/0057474 A1    Mar. 16, 2006

(30) Foreign Application Priority Data

Sep. 13, 2004    (JP) .............................. 2004-265699

(51) Int. Cl.
*G03F 1/00* (2006.01)

(52) U.S. Cl. .......................................................... 430/5

(58) Field of Classification Search ...................... 430/5; 428/428, 430

See application file for complete search history.

(56) References Cited

U.S. PATENT DOCUMENTS

2001/0055733 A1 * 12/2001 Irie et al. ..................... 430/396

FOREIGN PATENT DOCUMENTS

| JP | 60-39047 U | 3/1985 |
|---|---|---|
| JP | 63-8900 Y2 | 3/1988 |
| JP | 1-39653 B2 | 8/1989 |
| JP | 8-31723 A | 2/1996 |
| JP | 2000-356849 A | 12/2000 |
| JP | 2002-90978 A | 3/2002 |
| JP | 2002-162727 A | 6/2002 |
| JP | 2003-81654 A | 3/2003 |
| JP | 2003173019 A | 6/2003 |
| JP | 2003-264225 A | 9/2003 |
| JP | 2003-280168 A | 10/2003 |
| JP | 2002286797 A | 10/2003 |

* cited by examiner

*Primary Examiner*—Stephen Rosasco
(74) *Attorney, Agent, or Firm*—Sughrue Mion, PLLC

(57) ABSTRACT

In a transparent substrate for a mask blank, which is required to have a predetermined optical characteristic, a substrate mark is formed by cutting off a predetermined corner portion into an oblique section. The shape of the mark is determined in accordance with the optical characteristic of he substrate.

13 Claims, 11 Drawing Sheets

| TRANSPARENT SUBSTRATE FOR MASK BLANK | | |
|---|---|---|
| No. | SHAPE OF SUB-STRATE MARK | VARIATION OF TRANSMIT-TANCE IN SUBSTRATE PLANE |
| 1 |  | 88% OR HIGHER AT WAVELENGTH $\lambda$:193nm |
| 2 |  | 90% OR HIGHER AT WAVELENGTH $\lambda$:193nm |
| 3 |  | 90%±2% AT WAVELENGTH $\lambda$:193nm |
| 4 |  | 90%±1% AT WAVELENGTH $\lambda$:193nm |
| 5 |  | 90%±0.5% AT WAVELENGTH $\lambda$:193nm |

| | MASK BLANK | |
|---|---|---|
| | HALFTONE FILM | |
| No. | SHAPE OF FILM MARK (HALFTONE FILM) | VARIATION OF TRANSMITTANCE |
| 1 |  | 4% ±0.2% |
| 2 |  | 6% ±0.2% |
| 3 |  | 8% ±0.2% |

| MASK BLANK |||
|---|---|---|
| \multicolumn{3}{|c|}{LIGHT SHIELDING FILM} |||
| No. | FILM MARK (LIGHT SHIELDING FILM) | VARIATION OF TRANSMITTANCE |
| 1 |  | O.D. 3.0 ±0.1 |
| 2 |  | O.D. 3.0 ±0.05 |
| 3 |  | O.D. 3.0 ±0.02 |
| 4 |  | O.D. 2.0 ±0.1 |
| 5 |  | O.D. 2.0 ±0.05 |
| 6 |  | O.D. 2.0 ±0.02 |
| 7 |  | O.D. 2.5 ±0.1 |

(O.D.=OPTICAL DENSITY)

TRANSPARENT SUBSTRATE FOR MASK BLANK AND MASK BLANK

This application claims priority to prior Japanese patent application JP 2004-265699, the disclosure of which is incorporated herein by reference.

BACKGROUND OF THE INVENTION

This invention relates to a transparent substrate for a mask blank and a mask blank and, more specifically, to a transparent substrate for a mask blank and a mask blank which are capable of preventing deviation from specification with respect to an optical characteristic of the mask blank by assuring an optical characteristic of the transparent substrate or a thin film.

Proposal has been made of a transparent substrate or a mask blank which is characterized by a specially designed shape of a corner portion of the transparent substrate or a specially designed shape of a peripheral portion of a thin film formed on the transparent substrate (for example, see Japanese Examined Utility Model Application Publication (JP-Y) No. 63-8900 (patent document 1), Japanese Unexamined Patent Application Publication (JP-A) No. 2000-356849 (patent document 2), Japanese Unexamined Utility Model Application Publication (JP-U) No. 60-39047 (patent document 3).

The patent document 1 discloses a transparent substrate having a substrate mark formed on the corner portion in order to discriminate a material of the transparent substrate.

The patent document 2 discloses forming a substrate mark having an asymmetrical shape with respect to a diagonal line in order to discriminate many types of transparent substrates.

The patent document 3 discloses uniformly forming a light shielding film (an opaque film) on a transparent substrate except for a peripheral portion and a side surface. With this structure, during use of the mask blank, the light shielding film is not peeled from the peripheral portion and the side surface. It is therefore possible to prevent a pattern defect caused by dust generation.

However, each of the substrate marks disclosed in the patent documents 1 and 2 has only a function for discriminating the material of the transparent substrate while an uncoated portion without the light shielding film disclosed in the patent document 3 has only a function for preventing the dust generation from the mask blank.

On the other hand, recently, following miniaturization of a semiconductor device, the wavelength of an exposure light source to be used has been progressively shortened. Specifically, the exposure wavelength has reached 200 nm or less. For example, as such an exposure light source, use is made of an ArF excimer laser (wavelength of 193 nm), an F2 excimer laser (wavelength of 157 nm) or the like. Rapid development is made of a light shielding film for shielding light for these exposure light wavelengths or a phase shift film for shifting a phase of the light. As those films, a wide variety of film materials have been proposed (for example, see Japanese Unexamined Patent Application Publication (JP-A) No. 2002-162727 (patent document 4) and Japanese Unexamined Patent Application Publication (JP-A) No. 2003-280168 (patent document 5)).

Further, several proposals are made of a manufacturing method capable of suppressing variation in optical characteristic (for example, transmittance or phase difference), which is expected to cause problems upon forming these films (for example, see Japanese Unexamined Patent Application Publication (JP-A) No. 2002-90978 (patent documents 6)). Thus, at present, the variation of the optical characteristic of the films has been considerably suppressed.

However, when the optical characteristics (transmittance, reflectance or the like) of manufactured mask blanks were measured, those mask blanks which do not satisfy the specification with respect to the variation of the optical characteristics encounter problems at a certain ratio.

The present inventor has investigated the cause of the above-mentioned problem from various viewpoints. As a consequence, it has been found out that the variation of the transmittance is caused by absorption of the transparent substrate itself for the exposure light, which conventionally caused no problem.

Recently, a synthetic quartz glass is used as a substrate material of a mask blank for use with, as the exposure light source, the ArF excimer laser which has been rapidly developed at present. The synthetic quartz glass is also used as a substrate material of a mask blank for use with, as the exposure light source, the KrF excimer laser which is practically used at present. The exposure wavelength of the KrF excimer is 248 nm. Therefore, even if the synthetic quartz glass has production variation, the transmittance (the transmittance in a plate thickness direction) is 88% or higher (wavelength $\lambda$: 240 nm) for a 6025 size (thickness of 6.35 mm). Thus, no problems are caused.

However, if the wavelength of the exposure light source becomes short like in the ArF excimer laser (wavelength of 193 nm), the transmittance (the transmittance in the plate thickness direction) is sometimes 88% or lower for the 6025 size (thickness of 6.35 mm) because of the absorption of the substrate itself for the exposure light due to the production variation or the like of the synthetic quartz glass. Such reduction of the transmittance becomes remarkable in case where the exposure light has the wavelength of 200 nm or less (in particular, 140 nm to 200 nm).

In the present status, the production variation upon forming the thin film is not completely eliminated. As mentioned above, those mask blanks, which do not satisfy the specification with respect to the variation of the optical characteristic, are considered to deviate from the specification by a synergistic effect of the variation of the transmittance of the substrate material and the variation of the optical characteristic of the thin film.

SUMMARY OF THE INVENTION

It is therefore an object of this invention to provide a transparent substrate for a mask blank and a mask blank which are capable of preventing deviation from specification with respect to an optical characteristic of the mask blank by assuring an optical characteristic of the transparent substrate and a thin film.

To achieve the above-mentioned object, this invention provides a transparent substrate for a mask blank, which is required to have a predetermined optical characteristic and which is provided with a substrate mark formed by cutting off a predetermined corner portion into an oblique section and having a shape determined in accordance with the optical characteristic.

With this structure, the optical characteristic of the transparent substrate can be assured by the substrate mark. Thus, it is possible to solve such a problem that the mask blank deviated from specification due to the optical characteristic of the transparent substrate is manufactured.

Further, in the transparent substrate for a mask blank according to this invention, the substrate mark is formed by combining a plurality of oblique sections.

With this structure, it is possible to increase a number of types of the substrate mark and to assure the optical characteristic of the transparent substrate in detail.

Further, in the transparent substrate for the mask blank according to this invention, the optical characteristic is transmittance for an exposure wavelength and/or variation of transmittance in a substrate plane.

With this structure, it is possible to assure the transmittance for the exposure wavelength or the variation of the transmittance in the substrate plane and to prevent the deviation from the specification caused by the absorption of the exposure light by the transparent substrate itself.

Further, in the transparent substrate for a mask blank according to this invention, the exposure wavelength falls within a range between 140 nm and 200 nm.

With this structure, in a short wavelength region between 140 nm and 200 nm in which large variation of transmittance is caused due to the material of the transparent substrate, it is possible to assure the optical characteristic of the transparent substrate for a mask blank.

Further, in the transparent substrate for a mask blank according to this invention, a material of the transparent substrate is a synthetic quartz glass.

With this structure, even in the synthetic quartz glass in which the variation of the optical characteristic occurs due to production variation, it is possible to assure the optical characteristic of the transparent substrate for a mask blank.

Further, a mask blank according to this invention comprises a transparent substrate and a thin film formed on a principal surface of the transparent substrate, which is processed to become a mask pattern. The mask blank is provided with a substrate mark, which is formed by cutting off a predetermined corner portion of the transparent substrate into an oblique section and which has a shape determined in accordance with an optical characteristic of the transparent substrate, and a film mark which is formed on a peripheral portion of the thin film and which has a shape determined in accordance with an optical characteristic of the thin film.

With this structure, it is possible not only to assure the optical characteristic of the transparent substrate but also to assure the optical characteristic of the thin film. Thus, it is possible to prevent the deviation from specification by a synergistic effect thereof.

Further, in the mask blank according to this invention, the substrate mark is formed by combining a plurality of oblique sections.

With this structure, it is possible to increase a number of types of the substrate mark and to assure the optical characteristic of the transparent substrate in detail.

Further, in the mask blank according to this invention, the thin film is formed by a plurality of layers different in optical characteristic from one another, and the shape of the film mark is determined by the optical characteristics of these layers.

With this structure, it is possible to assure the optical characteristics of a plurality of layers different in optical characteristic and to prevent the deviation from specification due to these optical characteristics.

Further, in the mask blank according to this invention, the thin film includes a halftone film and a light shielding film. The film mark includes a first film mark which is formed by the halftone film and a second film mark which is formed by the light shielding film. The shape of the first film mark is determined in accordance with an optical characteristic of the halftone film and the shape of the second film mark is determined in accordance with an optical characteristic of the light shielding film.

With this structure, it is possible to individually assure the optical characteristic of the halftone film and the optical characteristic of the light shielding film so that the mask blank has higher reliability in optical characteristic.

Further, in the mask blank according to this invention, the optical characteristic is transmittance for an exposure wavelength and/or variation of the transmittance in a thin film plane.

With this structure, it is possible to assure the transmittance for the exposure wavelength or the variation of the transmittance in the thin film plane and to prevent the deviation from specification caused by the absorption of the exposure light by the transparent substrate itself, the production variation of the thin film, or the like.

Further, in the mask blank according to this invention, the exposure wavelength falls within a range between 140 nm and 200 nm.

With this structure, in a short wavelength region between 140 nm and 200 nm in which large variation of transmittance is caused due to the absorption of the exposure light by the transparent substrate itself and the production variation of the thin film, or the like, it is possible to assure the optical characteristic of the mask blank.

Further, in the mask blank according to this invention, a material of the transparent substrate is a synthetic quartz glass.

With this structure, even in the synthetic quartz glass in which the variation of the optical characteristic occurs due to production variation, it is possible to obtain the mask blank having a high reliability in optical characteristic.

As described above, according to this invention, the substrate mark having the shape determined in accordance with the optical characteristic of the transparent substrate is formed on the corner portion of the transparent substrate and, by this substrate mark, the optical characteristic of the transparent substrate is assured. Thus, it is possible to prevent the deviation from specification of the mask blank due to the optical characteristic of the transparent substrate.

Moreover, if the film mark having the shape determined in accordance with the optical characteristic of the thin film is formed on the peripheral portion of the thin film, the optical characteristic of the thin film is also assured. Thus, it is possible to prevent the deviation from specification by the synergistic effect of the optical characteristic of the transparent substrate and the optical characteristic of the thin film.

DESCRIPTION OF PREFERRED EMBODIMENT

Hereinafter, embodiments of this invention will be described with reference to the drawings.

(Transparent Substrate for Mask Blank)

Referring to FIGS. 1A through 1C and 2, description will be made of a transparent substrate for a mask blank according to an embodiment of this invention.

Figure 1A:
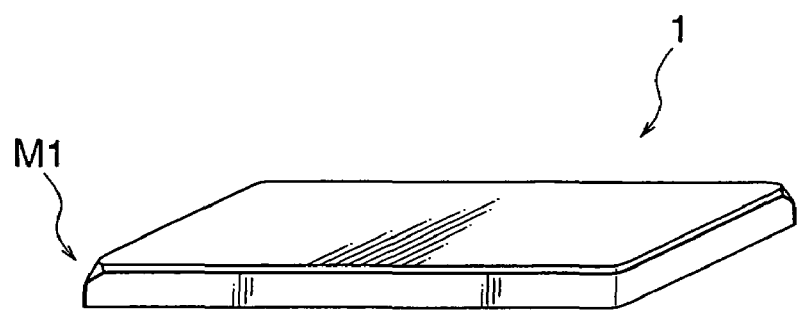
FIG. 1A is a perspective view of a transparent substrate for a mask blank according to an embodiment of this invention.

As shown in FIG. 1A, a transparent substrate 1 for a mask blank is a rectangular glass substrate made of a synthetic quartz glass or the like, and is formed by precisely polishing both principal surfaces thereof. On a predetermined corner portion of the transparent substrate 1, a substrate mark M1 is formed by cutting off six surfaces (two side surfaces, one principal surface, one R surface and two chamfered surfaces) into oblique sections.

Specifically, the substrate mark M1 is formed by shaping by the use of a diamond grindstone, followed by polishing into a mirror surface by using a polishing cloth or a polishing brush.

The shape of the substrate mark M1 is determined in accordance with the optical characteristic of the transparent substrate 1 (transmittance, variation of transmittance in a substrate plane, or the like). For example, the shape of the substrate mark M1 shown in FIG. 1B is applied in case where the variation of the transmittance in the substrate plane at the exposure wavelength of 193 nm falls within the range of 90%±2%.

In this manner, it is possible to assure the optical characteristic of the transparent substrate 1 is based upon the shape of the substrate mark M1.

Figure 1B:
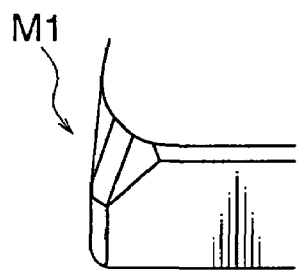
FIG. 1B is an enlarged perspective view of a substrate mark in the transparent substrate in FIG. 1A.
Figure 1C:
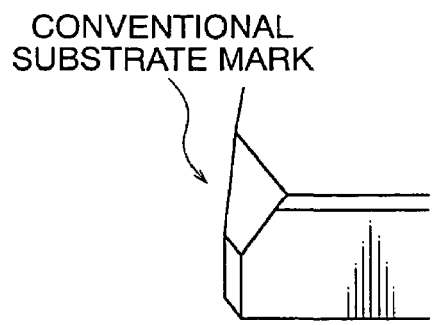
FIG. 1C is an enlarged perspective view of a conventional substrate mark.
Figure 2:
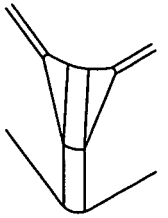
FIG. 2 is a diagram for explaining various shapes of the substrate mark in FIG. 1B.
Figure 2:
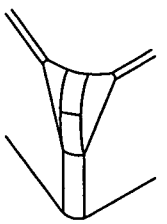
Figure 2:
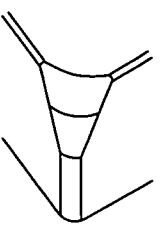
Figure 2:
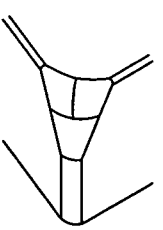
Figure 2:
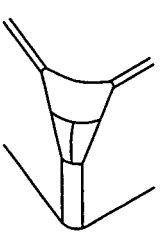

As illustrated in FIG. 1B, the substrate mark M1 of this embodiment is formed by combining a plurality of (for example, 3) oblique sections, as is different from a conventional substrate mark shown in FIG. 1C. If the substrate mark M1 is formed in the above-mentioned manner, it is possible not only to readily discriminate the transparent substrate 1 from the conventional transparent substrate which is not assured in optical characteristic but also to form a variety of substrate marks M1 different in shape from one another by the shapes of the oblique sections and combinations thereof. For example, as shown in FIG. 2, if a plurality of shapes are determined for the substrate mark M1 and a plurality of values of the optical characteristic are related to these shapes, respectively, it is possible to assure the optical characteristic of the transparent substrate 1 in detail.

As the material of the transparent substrate 1 having a desired transmittance for the exposure light wavelength within the range between 140 nm-200 nm, not only the synthetic quartz glass but also fluorine-doped synthetic quartz glass, calcium fluoride, or the like may be used.

(Mask Blank)

Subsequently, description will be made of a mask blank according to the embodiment of this invention with reference to FIGS. 3A to 3C through FIG. 7.

Figure 3A:
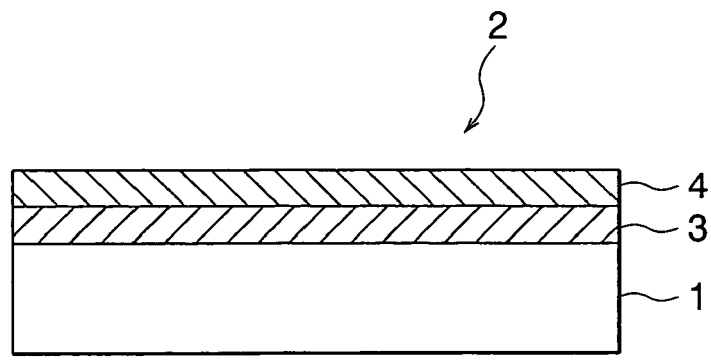
FIGS. 3A through 3C are diagrams for explaining a thin film formed on a mask blank.
Figure 3B:
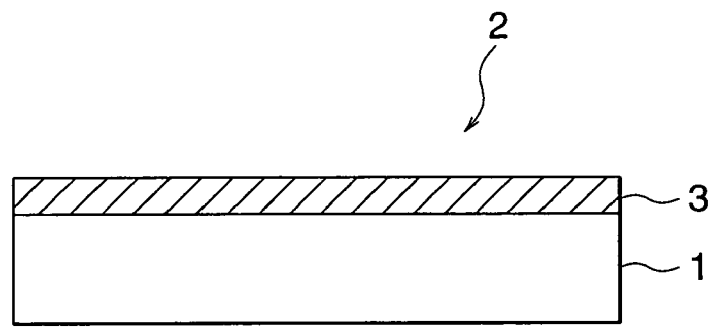
Figure 3C:
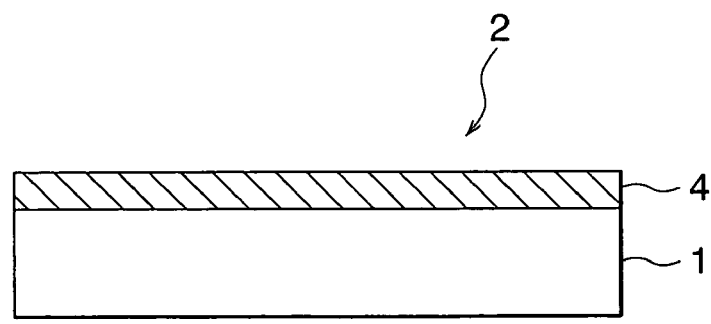

As illustrated in FIGS. 3A through 3C, the mask blank 2 is formed by depositing a desired thin film, such as a halftone film 3 and a light shielding film 4, on one principal surface (a principal surface opposite to a surface provided with the substrate mark M1) of the transparent substrate 1. Accordingly, the mask blank 2 according to this invention includes a halftone type phase shift mask comprising a halftone film 3 formed on the transparent substrate 1, a halftone type phase shift mask comprising the halftone film 3 and the light shielding film 4 formed on the transparent substrate 1, a photo mask blank comprising the light shielding film 4 formed on the transparent substrate 1, and a substrate recessed type phase shift mask blank (substrate etched type phase shift mask blank or quartz etched type phase shift mask blank). Alternatively, the mask blank 2 may be a mask blank comprising a resist film formed on the thin film.

Further, this invention is particularly effective for a mask blank for use with an exposure light source of the wavelength region of 140 nm-200 nm, such as a mask blank for ArF excimer laser exposure, a mask blank for F2 excimer laser exposure, or the like.

Figure 4A:
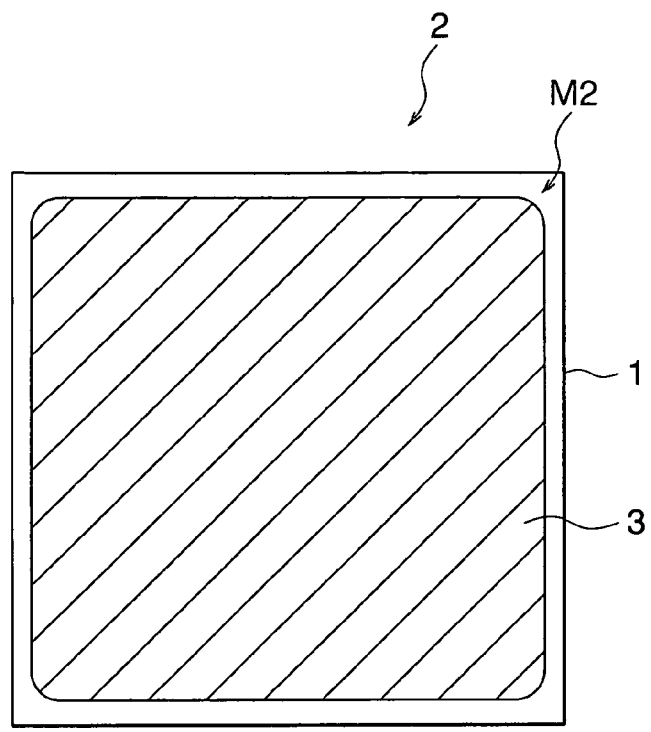
FIG. 4A is a plan view showing a halftone film illustrated in FIG. 3A.

FIG. 4A shows the halftone film 3 deposited on the principal surface of the transparent substrate 1. On a peripheral portion (corner portion) of the halftone film 3, a first film mark M2 is formed by a portion in which the halftone film 3 is not deposited. The shape of the film mark M2 is determined in accordance with the optical characteristic (the transmittance, the variation of the transmittance in the halftone film plane, the variation of the phase difference in the halftone film plane, or the like) of the halftone film 3. For example, the shape of the film mark M2 shown in FIG. 4A is applied in case where the variation of the transmittance of the halftone film 3 in the halftone film plane at the exposure wavelength of 193 nm is 6.0%±0.2% and the variation of the phase difference in the halftone film plane is 180°±3°. Thus, it is possible to assure the optical characteristic of the halftone film 3 on the basis of the shape of the film mark M2.

Figure 6:
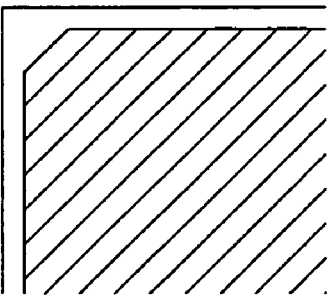
FIG. 6 is a diagram for explaining various shapes of a first film mark illustrated in FIG. 4A.
Figure 6:
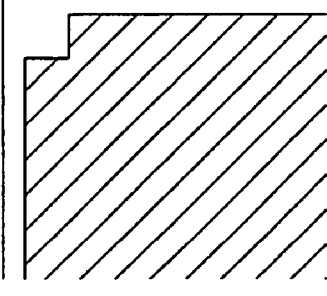
Figure 6:
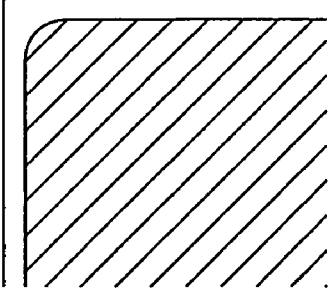

It is noted here that the shape or the type of the film mark M2 can be selected as desired. For example, as illustrated in FIG. 6, a plurality of shapes are determined for the film mark M2 and various values of the optical characteristic are related to these shapes, respectively. In this manner, it is possible to assure the optical characteristic of the halftone film 3 in detail.

Figure 4B:
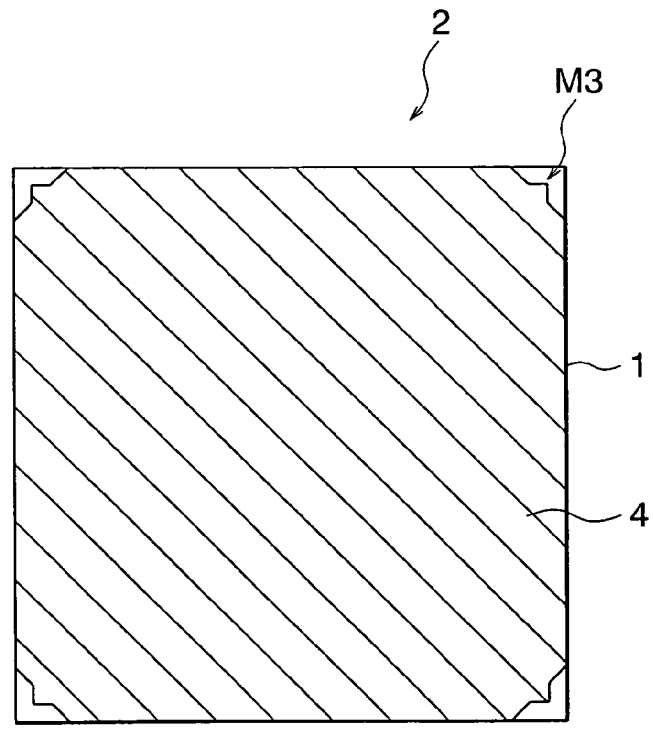
FIG. 4B is a plan view showing a light shielding film illustrated in FIG. 3A.

The FIG. 4B shows an antireflection light shielding film 4 deposited on the halftone film 3. On a peripheral portion (corner portion) of the light shielding film 4 formed on one principal surface, a second film mark M3 is formed by a portion in which the light shielding film 4 is not deposited. The shape of the film mark M3 is determined in accordance with the optical characteristic (the variation of the reflectance of in the light shielding film plane, the variation of the transmittance in the light shielding film plane, or the like) of the light shielding film 4. For example, the shape of the film mark M3 shown in FIG. 4B is applied in case where the variation of the transmittance of the light shielding film 4 in the light shielding film plane at the exposure wavelength of 193 nm is 3.0±0.1 in O.D. (optical density). Thus, it is possible to assure the optical characteristic of the light shielding film 4 on the basis of the shape of the film mark M3.

Figure 7:
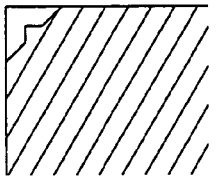
FIG. 7 is a diagram for explaining various shapes of a second film mark illustrated in FIG. 4B.
Figure 7:
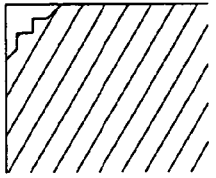
Figure 7:
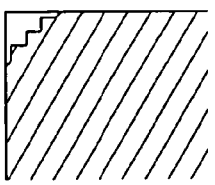
Figure 7:
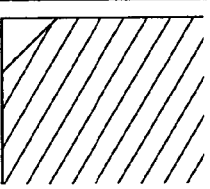
Figure 7:
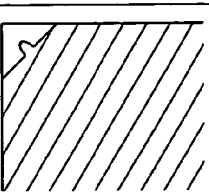
Figure 7:
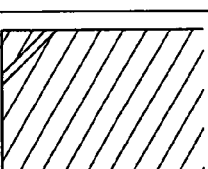
Figure 7:
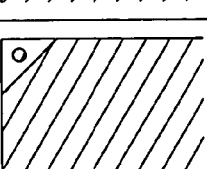

It is noted here that the shape or the type of the film mark M3 can be selected as desired. For example, as illustrated in FIG. 7, a plurality of shapes are determined for the film mark M3 and various values of the optical characteristic are related to these shapes. In this manner, it is possible to assure the optical characteristic of the light shielding film 4 in detail.

Figure 5:
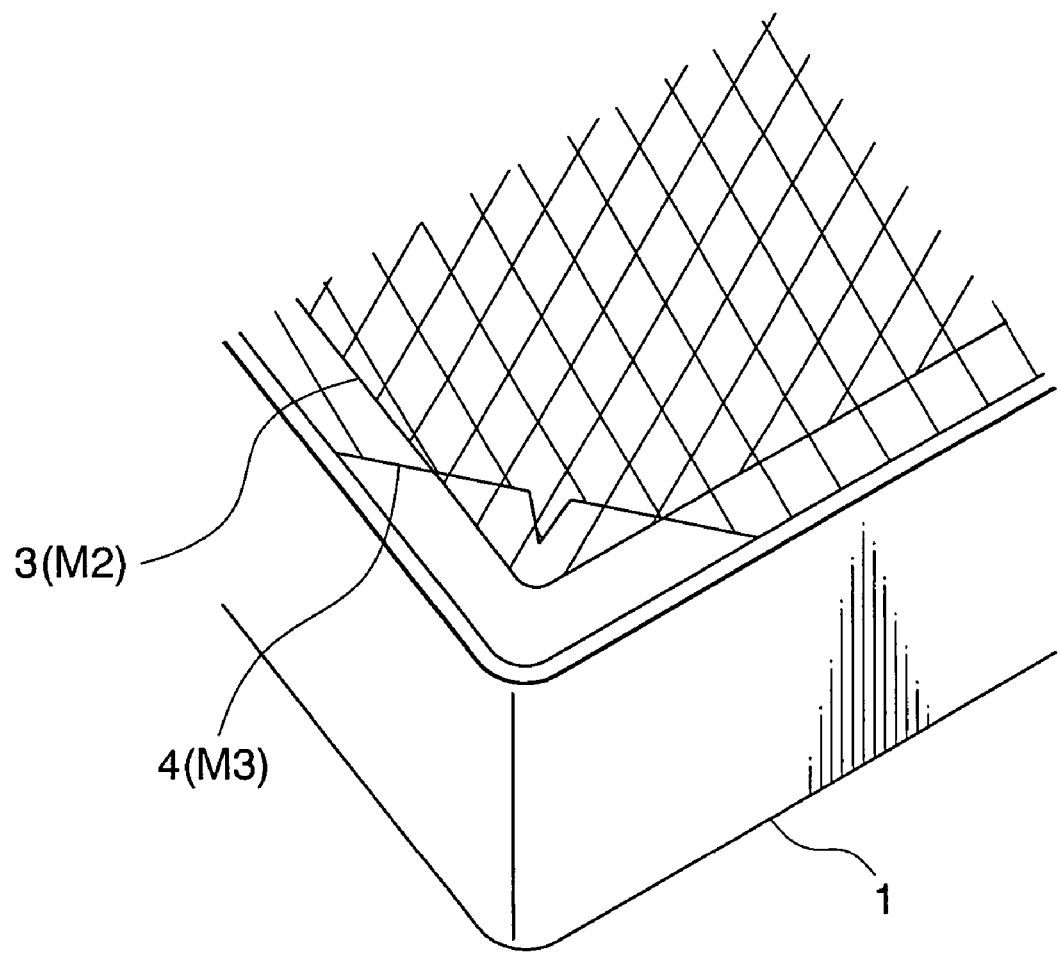
FIG. 5 is an enlarged perspective view of a characteristic part of FIG. 3A.

FIG. 5 shows an example of assuring a variety of optical characteristics (the variation of the transmittance in the halftone film plane, the variation of the phase difference in the halftone film plane, the variation of the transmittance in the light shielding film plane, or the like) of the mask blank 2 (the halftone type phase shift mask blank). Specifically, the optical characteristic of the thin film deposited on the transparent substrate 1 is assured by the shape of the film mark M2 formed on the peripheral portion of the halftone film 3 and the film mark M3 formed on the peripheral portion of the light shielding film 4. Further, the optical characteristic of the transparent substrate 1 is assured by the shape of the substrate mark M1 formed on the transparent substrate 1.

It is noted here that each of the film marks M2 and M3 may be formed at any position or positions among the four corner portions of the transparent substrate 1. Further, the optical characteristic of the thin film may be assured by the positions of the film marks M2 and M3 or a combination of the shape of the film mark and the position or positions of the film marks.

Further, the film shape on the corner portion can be confirmed from the side of the transparent substrate (namely, the surface opposite to the film-deposited surface, i.e., the surface provided with the substrate mark) with respect to the film mark M2 and from the surface of the light shielding film with respect to the film mark M3.

(Method of Manufacturing a Transparent Substrate for a Mask Blank)

Figure 8:
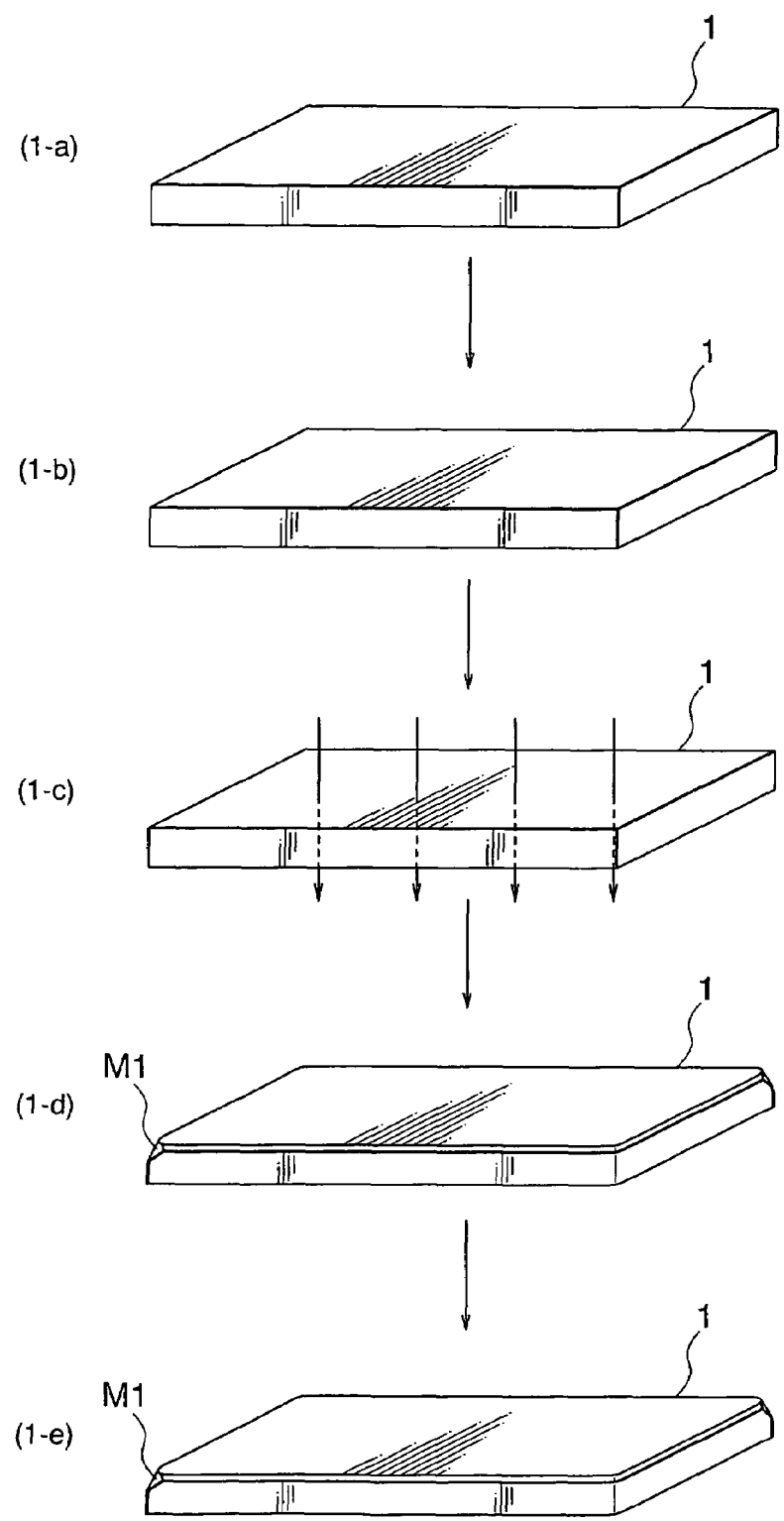
FIG. 8 is a diagram for explaining a method for manufacturing a transparent substrate for a mask blank according to an embodiment of this invention.

Next, description will be made of a method of manufacturing (supplying) the transparent substrate for a mask blank according to an embodiment of this invention with reference to FIG. 8. In the following, the transparent substrate will be explained as the synthetic quartz glass.

(Step 1-a)

By the use of the known production method (for example, the production method disclosed in Japanese Unexamined Patent Application Publication (JP-A) No. 8-31723 or Japanese Unexamined Patent Application Publication (JP-A) No. 2003-81654), a synthetic quartz glass ingot is produced and is cut into a predetermined substrate dimension (for example, 152 mm×152 mm×6.5 mm) to thereby produce a synthetic quartz glass plate.

(Step 1-b)

Then, the synthetic quartz glass plate is subjected to chamfering, and the surfaces (containing both principal surfaces) of the synthetic quartz glass plate are precisely polished.

(Step 1-c)

Next, light from a deuterium lamp (wavelength of 193 mm) is irradiated to nine positions of the polished one principal surface and the transmittance (the transmittance variation) in the substrate plane is measured. Herein, the measurement of the transmittance is, performed, for example, by the use of a spectrophotometer (U-4100 manufactured by Hitachi, Ltd.). The transmittance is calculated from the difference between input light amount of inspection light and output light amount thereof.

Herein, in-plane variation of the optical characteristic (transmittance) required for the mask blank for exposure by the ArF excimer laser and in-plane variation of the transmittance required for the transparent substrate (specification of the transparent substrate for the mask blank) taking the variation of transmittance in the thin film plane into account are set to 90%±2%.

(Step 1-d)

Then, for the transparent substrate in which the variation of the transmittance in the transparent substrate plane is 90%±2%, the substrate mark (the substrate mark shown in FIG. 1B) for assuring the variation of the transmittance in the substrate plane is formed at one diagonal position on one principal surface of the transparent substrate. The substrate mark is formed by cutting off six surfaces (including the principal surface, two edge surfaces, one R surface, and two chamfered surfaces forming the corner portion) into the oblique sections. In this manner, by forming the substrate mark having the shape in accordance with the optical characteristic of the transparent substrate, it is possible to assure the variation of the transmittance in the transparent substrate plane. Further, by forming the substrate mark at one diagonal position on one principal surface, it is possible to show that the substrate is the synthetic quartz glass.

(Step 1-e)

Subsequently, the surface (including both principal surfaces) of the transparent substrate is precisely polished again to thereby obtain the transparent substrate for a mask blank assured in optical characteristic (transmittance variation in the substrate plane).

A plurality of the transparent substrates for a mask blank thus obtained are contained in a known glass substrate holder (for example, disclosed in Japanese Unexamined Patent Application Publication (JP-A) No. 2003-264225), and supplied to a mask blank manufacturing department where the mask blanks are manufactured.

Although no description is made in the foregoing, a cleaning process step may be appropriately carried out. In the foregoing description, after measuring the transmittance in the transparent substrate plane, the surface of the transparent substrate is precisely polished again in the step 1-e. Alternatively, the transparent substrate for a mask blank may be supplied to the mask blank manufacturing department without performing the step 1-e.

(Method of Manufacturing the Mask Blank)

Figure 9:
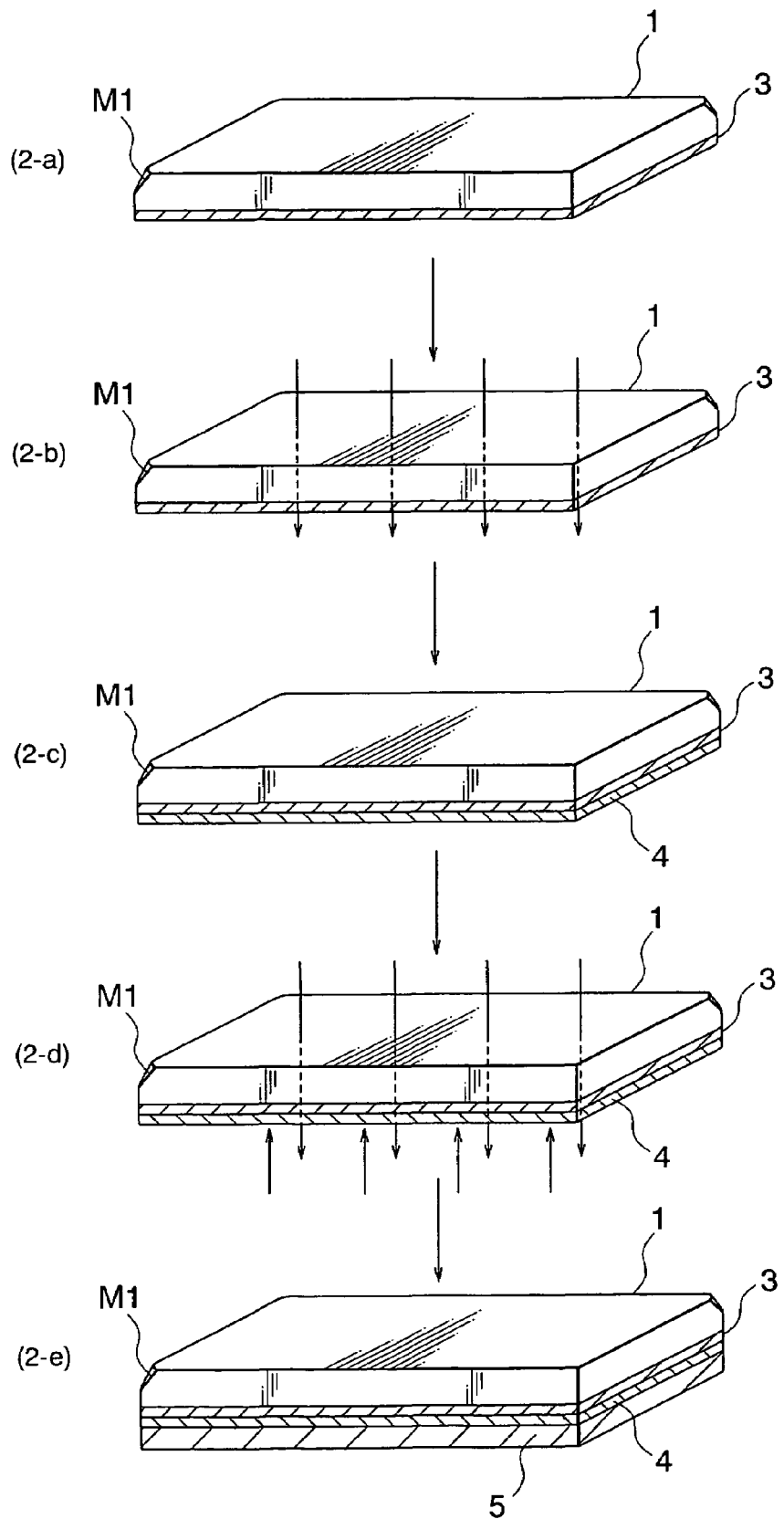
FIG. 9 is a diagram for explaining a method for manufacturing a mask blank according to an embodiment of this invention.

Next, description will be made of a method of manufacturing (supplying) a mask blank according to an embodiment of this invention with reference to FIGS. 9 through FIG. 11.

(Step 2-a)

By using the aforementioned transparent substrate for a mask blank assured in optical characteristic (transmittance variation in the substrate plane), the thin film (the halftone film) to become the mask pattern is formed by sputtering on the principal surface opposite to the surface provided with the substrate mark. The deposition of the halftone film is preferably carried out by the use of a sputtering apparatus having the following structure in order to suppress the transmittance variation in the halftone film plane and the variation of the phase difference in the halftone film plane.

Figure 10:
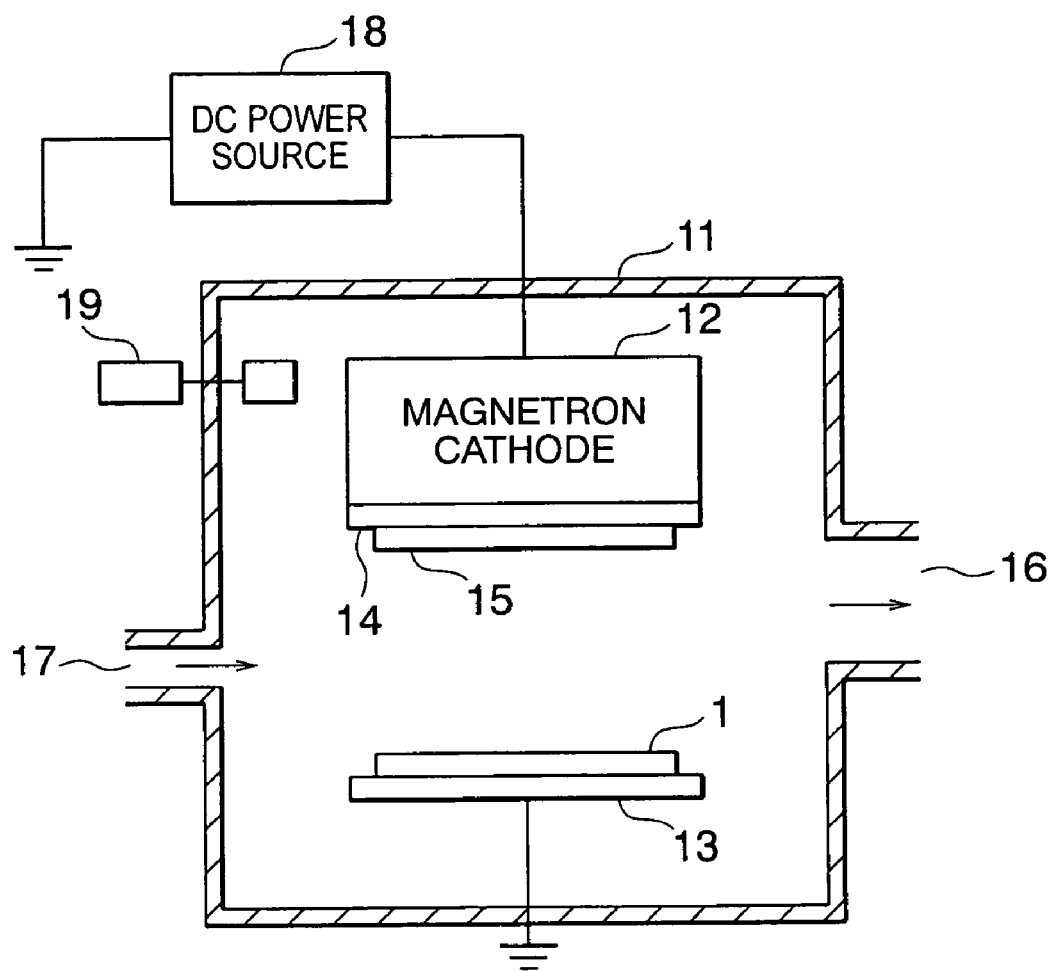
FIG. 10 is a schematic view of a sputtering apparatus.

As illustrated in FIG. 10, the sputtering apparatus has a vacuum chamber 11. In the vacuum chamber 11, a magnetron cathode 12 and a substrate holder 13 are arranged. A sputtering target 15 adhered to a backing plate 14 is mounted to the magnetron cathode 12. The backing plate 14 is directly or indirectly cooled by a water-cooling mechanism. The magnetron cathode 12, the backing plate 14 and the sputtering target 15 are electrically connected to one another. On the substrate holder 13, the transparent substrate 1 is placed.

Figure 11:
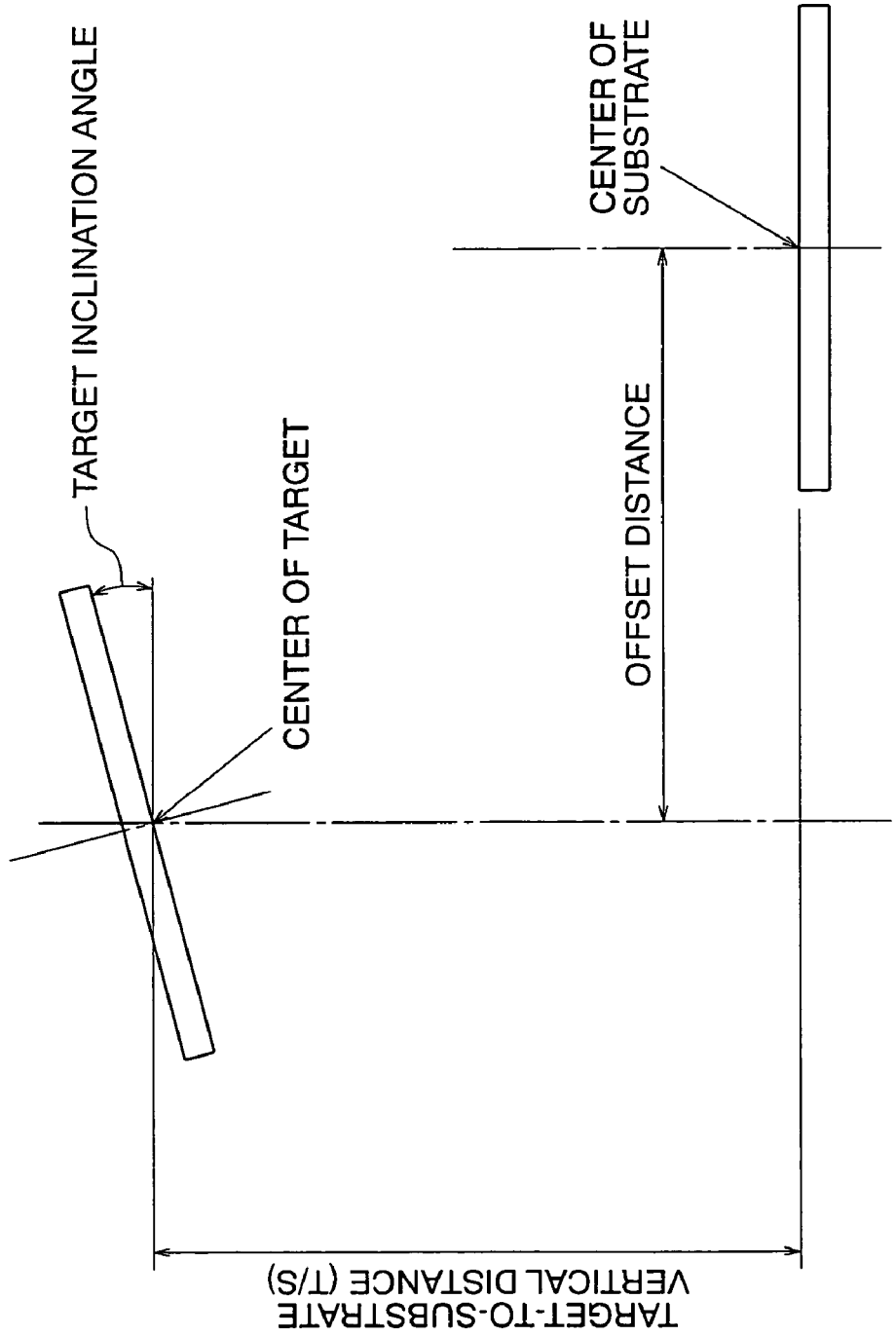
FIG. 11 is a diagram showing a characteristic part of the sputtering apparatus in FIG. 10.

As shown in FIG. 11, the sputtering target 15 and the transparent substrate 1 are arranged so that confronting surfaces form a predetermined angle. In this case, an offset distance (for example, 340 mm) between the sputtering target 15 and the transparent substrate 1, a target-to-substrate vertical distance (for example, 380 mm), and a target inclination angle (for example, 15°) are appropriately determined.

The vacuum chamber 11 is exhausted via a discharge port 16 by a vacuum pump. After an atmosphere inside the vacuum chamber 11 reaches such a vacuum degree that does not affect the characteristic of the film to be formed, a mixed gas containing nitrogen is introduced from a gas inlet port 17. Then, sputtering is carried out by applying a negative voltage to the magnetron cathode 12 by the use of a DC power source 18. The DC power source 18 has an arc detection function so as to monitor a discharge state during sputtering. The pressure inside of the vacuum chamber 11 is measured by a pressure gauge 19. The transmittance of the halftone film formed on the transparent substrate is adjusted by species and a mixing ratio of gases introduced through the gas inlet port 17. In case of the mixed gas of argon and nitrogen, the transmittance is increased by increasing the ratio of nitrogen. In case where a desired transmittance is not obtained only by adjusting the ratio of nitrogen, it is possible to further increase the transmittance by adding oxygen into the mixed gas containing nitrogen. The phase angle of the halftone film is adjusted by a sputtering time so that the phase angle at the exposure wavelength is adjusted to about 180°.

The optical characteristic (the variation of the transmittance, the variation of the phase difference, or the like) of the halftone film is substantially assured by the deposition method. Therefore, the first film mark assuring the optical characteristic of the halftone film is formed simultaneously with the sputtering deposition of the half tone film. Specifically, the halftone film is deposited by sputtering in the state where the peripheral portion of the substrate is shielded so as to prevent deposition thereat. Thus, a portion without the halftone film is formed at the peripheral portion of the transparent substrate to serve as the first film mark.

(Step 2-b)

Then, light from a deuterium lamp (wavelength of 193nm) is irradiated to nine positions of the principal surface of the transparent substrate with the halftone film on the side of the halftone film and the transmittance (the variation of the transmittance) in the halftone film plane and the phase difference (the variation of the phase difference) in the halftone film plane are measured. Herein, the measurement of the transmittance may be carried out by the use of the spectrophotometer (U-4100 manufactured by Hitachi, Ltd.) while the measurement of the phase difference is carried out by the use of a phase difference measuring instrument (MPM-193 manufactured by Lasertec Corporation).

Herein, the variation of the optical characteristic in the halftone film plane required for the mask blank for the ArF excimer laser exposure is 6.0%±0.2% and 180°±3 ° with respect to the transmittance and the phase difference, respectively. Therefore, it has been confirmed whether or not these specifications are satisfied.

(Step 2-c)

Subsequently, on the halftone film, the light shielding film is deposited by sputtering. The deposition of the light shielding film is preferably performed by the use of the sputtering apparatus same as that mentioned above in order to suppress the variation of the optical characteristic (the variation of the transmittance in the light shielding film plane).

Since the optical characteristic (the variation of the transmittance in the light shielding film plane) is substantially assured by the deposition method, the second film mark assuring the optical characteristic of the light shielding film is formed simultaneously with the sputtering deposition of the light shielding film. Specifically, the light shielding film is deposited by sputtering in the state where the four corner portions of the substrate is shielded so as to prevent deposition thereat. In this manner, portions without the light shielding film are formed on the corner portions of the transparent substrate to serve as the second film mark.

(Step 2-d)

Then, light from a deuterium lamp (wavelength of 193 nm) is irradiated to nine positions of the surface of the light shielding film in the transparent substrate with the light shielding film, and the transmittance (the variation of the transmittance) in the light shielding film plane is measured. Herein, the measurement of the transmittance may be carried out by the use of the spectrophotometer (U-4100 manufactured by Hitachi, Ltd.)

Herein, the in-plane variation of the optical characteristic (transmittance) required for the mask blank for the ArF excimer laser exposure is 3.0±0.1 in O.D. (optical density). Therefore, it has been conformed whether or not this specification is satisfied.

(Step 2-e)

Next, after applying a resist on the surface of the light shielding film, heat treatment is carried out to form the resist film. Thus, the mask blank (the halftone type phase shift mask blank) is obtained. The mask blank thus obtained is assured in optical characteristic (the transmittance variation in the halftone film plane of 6.0%±0.2%, the phase difference variation in the halftone film plane of 180°±3°, the transmittance variation in the light shielding film plane of 20%±2%) by the shape of the substrate mark, the shape of the film mark of the halftone film and the shape of the film mark of the light shielding film.

A plurality of the mask blanks thus obtained are contained in a known blank container (for example, as disclosed in Japanese Examined Patent Application Publication (JP-B) No. 1-39653), and are supplied to a mask manufacturing department where masks are manufactured.

EXAMPLES AND COMPARATIVE EXAMPLES

Hereinafter, with reference to examples and comparative examples, description will be specifically made of the transparent substrate for a mask blank according to this invention.

Example 1

With respect to a synthetic quartz glass substrate of 152.4 mm×152.4 mm±6.35 mm whose surfaces were precisely polished, the transmittance in the substrate plane was measured, and the synthetic quartz glass substrate in which the transmittance variation fell within the range of 90%±2% was prepared. Herein, on the synthetic quartz glass substrate, the substrate mark shown in FIG. 1B was formed at one corner portion of the synthetic quartz glass substrate so as to assure the variation of the transmittance in the substrate plane at the exposure wavelength of 193 nm.

Then, by using the aforementioned sputtering apparatus, halftone type shift mask blanks for the ArF excimer laser exposure, 100 in number, were manufactured.

Specifically by the use of a mixed target (Mo:Si=8:92 mol %) of molybdenum (Mo) and silicon (Si), the halftone film (the film thickness of about 67 nm) made of molybdenum and silicon and nitrided was formed on the synthetic glass substrate by reactive sputtering (DC sputtering) under a mixed gas atmosphere (Ar:$N_2$=10%:90%, the pressure: 0.1 Pa) of argon (Ar) and nitrogen ($N_2$). It is noted here that the halftone film had the film composition of Mo:Si:N=7:45:48.

Further, upon deposition by sputtering, a part of the synthetic quartz glass substrate was covered by a shielding plate in an area of about 2 mm from the edge of the deposition surface faced to the sputtering target. In this manner, the region without the halftone film was formed in the area of about 2 mm from the edge of the glass substrate to thereby obtain the first film mark shown in FIG. 4A.

By the method of the step 2-b, the transmittance variation and the phase difference variation in the halftone film plane were measured for the manufactured 100 samples. As a result of the measurement, for all of the 100 samples, the transmittance variation in the halftone film plane was 6.0%±0.2% while the phase difference variation in the halftone film plane was 180°±3°. Thus, it was confirmed that the specifications were satisfied.

Subsequently, after applying a resist by the use of a spin coating apparatus, heat treatment was carried out to form a resist film having the film thickness of 400 nm on the halftone film. Thus, the halftone type phase shift mask blank was obtained.

The halftone type phase shift mask blanks, 100 in number, thus obtained satisfied the transmittance variation of 6.0%±0.2% in the thin film plane and the phase difference variation of 180°±3° in the thin film plane as the specifications by the shape of the substrate mark and the shape of the film mark of the halftone film.

Example 2

With respect to a synthetic quartz glass substrate of 152.4 mm×152.4 mm×6.35 mm whose surfaces were precisely polished, the transmittance in the substrate plane was measured, and the synthetic quartz glass substrate in which the transmittance variation fell within the range of 90%±2% was prepared. Herein, on the synthetic quartz glass substrate, the substrate mark shown in FIG. 1B was formed at one corner portion of the synthetic quartz glass substrate so as to assure the variation of the transmittance in the substrate plane at the exposure wavelength of 193 nm.

Then, by using the aforementioned sputtering apparatus, halftone type shift mask blanks for the ArF excimer laser exposure, 100 in number, were manufactured.

Specifically by the use of a mixed target (Mo:Si=8:92 mol %) of molybdenum (Mo) and silicon (Si), the halftone film (the film thickness of about 67 nm) made of molybdenum and silicon and nitrided was formed on the synthetic glass substrate by reactive sputtering (DC sputtering) under a mixed gas atmosphere (Ar:$N_2$ =10%:90%, the pressure: 0.1 Pa) of argon (Ar) and nitrogen ($N_2$). It is noted here that the halftone film had the film composition of Mo:Si:N=7:45:48.

Further, upon deposition by sputtering, a part of the synthetic quartz glass substrate was covered by a shielding plate in an area of about 2 mm from the edge of the deposition surface faced to the sputtering target. In this manner, the region without the halftone film was formed in the area of about 2 mm from the edge of the glass substrate to thereby obtain the first film mark shown in FIG. 4A.

By the method of the step 2-b, the transmittance variation and the phase difference variation in the halftone film plane were measured for the manufactured 100 samples. As a result of the measurement, the transmittance variation in the halftone film plane was 6.0%±0.2% while the phase variation in the halftone film plane was 180°±3°. Thus, it was confirmed that the specifications were satisfied.

Then, by using the aforementioned sputtering apparatus, the light shielding film was formed on the halftone film.

Specifically, using a chromium (Cr) target, the chromium nitride film (the film thickness of about 15 nm) was formed on the synthetic quartz glass substrate by reactive sputtering (DC sputtering) under a mixed gas atmosphere (Ar: 80%, $N_2$: 20%, the pressure: 0.1 Pa) of argon (Ar) and nitrogen ($N_2$). It is noted here that the chromium nitride film has the film composition of Cr:N=80:20.

Next, using a chromium target, a chromium carbide film (the film thickness of about 20 nm) was formed by reactive sputtering (DC sputtering) under a mixed gas atmosphere (Ar:$CH_4$=95%:5%, the pressure: 0.1 Pa) of argon (Ar) and methane ($CH_4$). It is noted here that the chromium carbide film had the film composition of Cr:C=94:6.

Then, using the chromium target, a chromium oxide nitride film (the film thickness of about 20 nm) was formed by reactive sputtering (DC sputtering) under a mixed gas atmosphere (Ar:NO=85.5%:14.5%, the pressure: 0.1 Pa) of argon (Ar) and nitrogen monoxide (NO). It is noted here that the chromium oxide nitride film had the film composition of Cr:O:N=45:30:25.

Further, upon deposition by sputtering, four corner portions of the deposition surface of the synthetic quartz glass substrate which is faced to the sputtering target were covered with a shielding plate of a right triangle shape (one side having the length of about 6 mm, with a triangle notch formed at one position at the center of a side faced to a right angle). In this manner, the region without the light shielding film was formed in the area of about 6 mm as the length of the side sandwiching the right angle was formed at each of four corner portions of the glass substrate to thereby obtain the second film mark shown in FIG. 4B.

By the method of the step 2-d, the transmittance variation in the light shielding film plane was measured for 100 samples prepared. As a result of the measurement, the transmittance was 3.0±0.1 in O.D. (optical density). Thus, it was confirmed that the specification was satisfied.

Subsequently, after applying a resist by the use of the spin coating apparatus, heat treatment was carried out to form a resist film having the film thickness of 400 nm on the halftone film. Thus, the halftone type phase shift mask blank was obtained.

The halftone type phase shift mask blanks, 100 in number, thus obtained satisfied the transmittance variation of 6.0%±0.2% in the halftone film plane, the phase difference variation of 180°±3° in the halftone film plane and the transmittance variation of O.D. of 3.0±0.1 in the light shielding film plane as the specifications by the shape of the substrate mark, the shape of the film mark of the halftone film and the shape of the film mark of the light shielding film.

Comparative Example

A conventional synthetic quartz glass substrate (a glass plate provided with a substrate mark to discriminate glass species of the glass substrate) assured in transmittance of a predetermined level or higher was subjected to precision polishing of its surfaces and the synthetic quartz glass substrate of 152.4 mm×152.4 mm×6.35 mm was prepared. Herein, on the synthetic quartz glass substrate, the substrate mark having the shape shown in FIG. 1C was formed.

Then, in the manner similar to the example 1, halftone type phase shift mask blanks for the ArF excimer laser exposure, 100 in number, were manufactured by using the aforementioned sputtering apparatus.

By the method of the step 2-b, the transmittance variation and the phase difference variation were measured with respect to 100 samples thus manufactured. As a result of the measurement, 94 among 100 samples satisfied the specification including the transmittance variation of 6.0%±0.2% and the phase difference variation of 180°±3°. 6 samples were deviated from the specification.

With respect to 6 films deviated from the specification, the halftone film was peeled off from the synthetic quartz glass substrate, and thereafter the substrate was polished again. Then, the transmittance variation of the synthetic quarts glass substrate in the substrate plane was measured. As a result, it was confirmed that the transmittance was varied within the range of 90%±10%.

Thus, in case where the halftone type phase shift mask blank for the ArF excimer laser exposure was manufactured by the use of the glass substrate which was not assured in transmittance variation in the synthetic quartz glass substrate plane for the exposure wavelength, those mask blanks which did not satisfy the specification were obtained at a certain rate. However, as in the examples, in case where use was made of the glass substrate assured in transmittance variation in the synthetic quartz glass substrate plane, all of the manufactured mask blanks satisfied the specification.

With respect to the 94 glass substrates with the halftone films, it was confirmed that the mask blanks satisfied the specification. Therefore, if the halftone film formed on the glass substrate is removed to form the first film mark by irradiating the laser light to four corner portions of the substrate, it is possible to assure the optical characteristic (the transmittance variation in the halftone film plane and the phase difference variation in the halftone film plane) of the mask blank.

Thus, the film mark may be formed by removing a specific region after the deposition other than simultaneous formation with the deposition as described in connection with the above-mentioned examples. For example, use may be made of a method of removing the specific region by laser light, a method of removing the specific region by utilizing an etching process, or a method of removing the specific region by contacting a fine probe or the like. In case where the removal is carried out after the deposition, the film mark may be formed after the optical characteristic of the thin film formed on the transparent substrate is measured and it is confirmed that the predetermined specification is satisfied.

This invention is applicable to the transparent substrate for a mask blank and the mask blank. In particular, this invention is useful for the mask blank for use with the ArF excimer laser or the F2 excimer laser as the exposure light source and can prevent the deviation from the specification due to the variation of the optical characteristic.

While this invention has thus far been disclosed in conjunction with a few embodiments and examples thereof, it will be readily possible for those skilled in the art to put this invention into practice in various other manners.

What is claimed is:

1. A mask blank comprising a transparent substrate and a thin film formed on a principal surface of the transparent substrate to become a mask pattern, the mask blank being provided with:
   a substrate mark which is formed by cutting off a predetermined corner portion of the transparent substrate into an oblique section and which has a shape determined in accordance with first assuring information with respect to an optical characteristic of the transparent substrate, and
   a film mark which is formed on a peripheral portion of the thin film and which has a shape determined in accordance with second assuring information with respect to an optical characteristic of the thin film.

2. A mask blank claimed in claim 1, wherein:
the substrate mark is formed by combining a plurality of oblique sections.

3. A mask blank claimed in claim 1, wherein:
the thin film is formed by a plurality of layers different in optical characteristic from one another;
the film mark having a shape determined by the optical characteristics of the layers, the optical characteristics relating with the second assuring information.

4. A mask blank claimed in claim 3, wherein:
the thin film includes a halftone film and a light shielding film,
the film mark including a first film mark which is formed by the halftone film and a second film mark which is formed by the light shielding film,
the first film mark having a shape determined by third assuring information with respect to an optical characteristic of the halftone film, and
the second film mark having a shape determined by fourth assuring information with respect to an optical characteristic of the light shielding film.

5. A mask blank claimed in claim 4, wherein:
the third assuring information is at least one of transmittance for an exposure wavelength, variation of the transmittance in a plane of the halftone film, and variation of phase difference in the plane of the halftone film.

6. A mask blank claimed in claim 4, wherein:
the fourth assuring information is at least one of variation of reflectance for an exposure wavelength in a plane of the light shielding film and variation of transmittance for the exposure wavelength in the plane of the light shielding film.

7. A mask blank claimed in claim 4, wherein:
each of the first film mark and the second film mark is formed at a position that gives no influence for formation of the mask pattern.

8. A mask blank as claimed in claim 1, wherein:
the exposure wavelength falls within a range between 140 nm and 200 nm.

9. A mask blank as claimed in claim 1, wherein:
a material of the transparent substrate is a synthetic quartz glass.

10. A mask blank as claimed in claim 1, wherein:
the first assuring information is at least one of transmittance for an exposure wavelength and variation of the transmittance in a plane of the transparent substrate.

11. A mask blank as claimed in claim 1, wherein:
the thin film includes at least a halftone film, and
the second assuring information is at least one of transmittance for an exposure wavelength, variation of the transmittance in a plane of the halftone film, and variation of phase difference in the plane of the halftone film.

12. A mask blank as claimed in claim 1, wherein:
the thin film includes at least a light shielding film, and
the second assuring information is at least one of variation of reflectance for an exposure wavelength in a plane of the light shielding film and variation of transmittance for the exposure wavelength in the plane of the light shielding film.

13. A mask blank as claimed in claim 1, wherein:
the film mark is formed at a position that gives no influence for formation of the mask pattern.

* * * * *